United States Patent
Liu et al.

(10) Patent No.: US 8,648,623 B2
(45) Date of Patent: Feb. 11, 2014

(54) HIGH SIDE CURRENT SENSE AMPLIFIER

(76) Inventors: Hengsheng Liu, Colorado Springs, CO (US); Edson Wayne Porter, Colorado Springs, CO (US); Gregory Jon Manlove, Colorado Springs, CO (US)

( * ) Notice: Subject to any disclaimer, the term of this patent is extended or adjusted under 35 U.S.C. 154(b) by 19 days.

(21) Appl. No.: 13/448,161

(22) Filed: Apr. 16, 2012

(65) Prior Publication Data

US 2013/0271216 A1  Oct. 17, 2013

(51) Int. Cl.
*G01R 19/00* (2006.01)

(52) U.S. Cl.
USPC .................. 327/51; 327/52; 327/63; 327/65; 327/563

(58) Field of Classification Search
USPC ............. 327/51, 52, 54, 63, 65, 67, 124, 563; 330/253, 258, 260
See application file for complete search history.

(56) References Cited

U.S. PATENT DOCUMENTS

| | | | |
|---|---|---|---|
| 6,456,159 B1 * | 9/2002 | Brewer ......................... | 330/253 |
| 7,202,738 B1 | 4/2007 | Huijsing et al. | |
| 7,671,677 B2 * | 3/2010 | Kindt et al. .................... | 330/258 |
| 7,831,234 B2 * | 11/2010 | Schelmbauer et al. ....... | 330/258 |
| 2010/0327887 A1 | 12/2010 | Denison et al. | |

OTHER PUBLICATIONS

Witte et al., A Current-Feedback Instrumentation Amplifier With 5 Offset for Bidirectional High-Side Current-Sensing, IEEE Journal of Solid-State Circuits, vol. 43, No. 12, Dec. 2008, pp. 2769-2775.*
International Search Report and Written Opinion, 14 Pages.
Johan F Witte et al., "A Current-Feedback Instrumentation Amplifier with 5 Offset for Bidirectional High-Side Current-Sensing", IEEE Journal of Solid-State Circuits, Dec. 1, 2008, pp. 2769-2775, vol. 43, No. 12, IEEE Service Center, Piscataway, NJ, USA.
Michiel A. P. Pertijs, "A 140 db-CMRR Current-Feedback Instrumentation Amplifier Employing Ping-Pong Auto-Zeroing and Chopping", IEEE Journal of Solid-State Circuits, Oct. 1, 2010, pp. 2044-2056, vol. 43, No. 10, IEEE Service Center, Piscataway, NJ, USA.

* cited by examiner

*Primary Examiner* — Long Nguyen
(74) *Attorney, Agent, or Firm* — Patent Law Group LLP; Brian D Ogonowsky

(57) ABSTRACT

A single stage current sense amplifier is described that generates a differential output that is proportional to a current through a sense resistor. The voltage across the sense resistor is Vsense. The current sense amplifier includes a differential transconductance amplifier having high impedance input terminals. An on-chip RC filter filters transients in the Vsense signal. A feedback circuit for each leg of the amplifier causes a pair of input transistors to conduct a fixed constant current irrespective of Vsense, which stabilizes the transconductance. A gain control resistor (Re) is coupled across terminals of the pair of input transistors and has Vsense across it. The current through the gain control resistor is therefore Vsensex1/Re. A level shifting circuit coupled to each of the input transistors lowers a common mode voltage at an output of the amplifier. Chopper circuits at the input and output cancel any offset voltages.

20 Claims, 3 Drawing Sheets

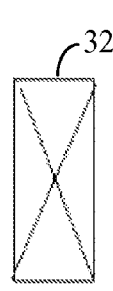
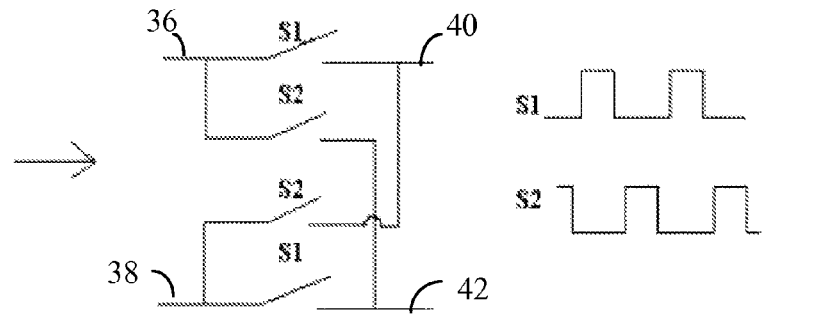
Fig. 5A  Fig. 5B  Fig. 5C
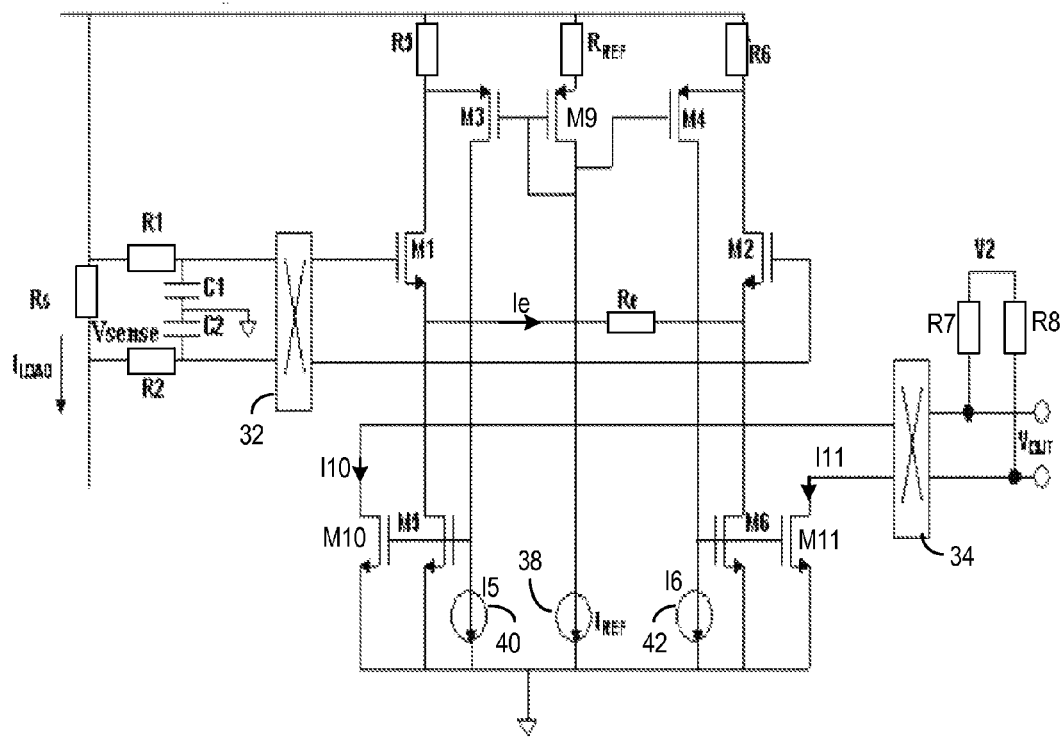
Fig. 6

HIGH SIDE CURRENT SENSE AMPLIFIER

FIELD OF THE INVENTION

This invention relates to current sense amplifiers and, in particular, to a single stage differential current sense amplifier.

BACKGROUND

There are many types of current sense amplifiers that output a voltage proportional to a current flowing through a low value sense resistor. The voltage across the resistor is typically referred to as Vsense. The proportion is typically a ratio involving two or more precision resistors.

An ideal current sense amplifier will desirably amplify a small, low-frequency Vsense signal in the presence of a large common mode voltage transient without perturbations in gain. In order to accurately process the wanted Vsense signal and reject the unwanted transient, DC precision and high common mode rejection ratios are required. Because the amplifier's input common mode voltage can be high relative to specified operating voltages of circuitry downstream from the current sense amplifier, it is desirable that the sense amplifier's output be level-shifted from the high average input common mode voltage down to a lower system operational voltage.

In many applications, Vsense is not a DC voltage since the current is generated by the closing of switch, and the switch may be operating at a high frequency. Vsense therefore typically has spikes and other transients. Such transients sometimes cause nonlinear behavior in one or more devices in the current sense amplifier, such as saturation and slewing, resulting in inaccurate current sensing. To remove such high frequency transients, RC filters are required at the input. Since the input impedance of the current sense amplifier is typically a low impedance, only small value resistors and large off-chip capacitors can be used in the off-chip filters, adding expense and size to the current sense amplifier.

Differential current sense amplifiers include an inverting leg and a non-inverting leg. If the legs are not perfectly matched, which is typical in an actual device, there will be some offset (error) in the differential output due to the different electrical characteristics of the legs.

What is needed is an accurate current sense amplifier integrated circuit that generates a differential output, has a very stable gain irrespective of the common mode voltage level, uses a small RC filter that can be implemented on-chip to filter out transients, provides a level shifted differential output voltage, and has a differential output voltage does not include an offset.

SUMMARY

The present invention uses a linearized differential transconductance amplifier as part of a current sense amplifier. The amplifier has a high input impedance, enabling an on-chip RC filter to be used to filter out transients caused by, for example, the switching by a voltage converter.

A feedback loop in each leg of the amplifier, comprising MOSFETs, helps to stabilize the gain of the amplifier with varying Vsense voltages. Other types of transistors can be used.

The circuit level-shifts a high common mode voltage in Vsense to a low common mode voltage and amplifies its differential component, enabling the low common mode output voltage to be applied to all types of downstream devices, such as analog-to-digital converters (ADCs).

To avoid the differential output voltage being offset by unmatched legs of the amplifier, synchronized choppers are employed at the input and output of the amplifier to cancel out any mismatch between the two legs.

The current sense amplifier comprises a single stage.

Other embodiments are described.

BRIEF DESCRIPTION OF THE DRAWINGS

FIGS. 5A, 5B, and 5C illustrate the construction and operation of a chopper circuit that may be used in the current sense amplifiers of FIGS. 4 and 6 to cancel offsets due to mismatched components.

FIG. 6 is a schematic of another single chip current sense amplifier, in accordance with another embodiment of the invention, which uses synchronized choppers to cancel offsets in the output voltage, where the output voltage is referenced to a non-ground bias voltage.

Elements that are the same or equivalent are labeled with the same numeral.

DETAILED DESCRIPTION

Figure 1:
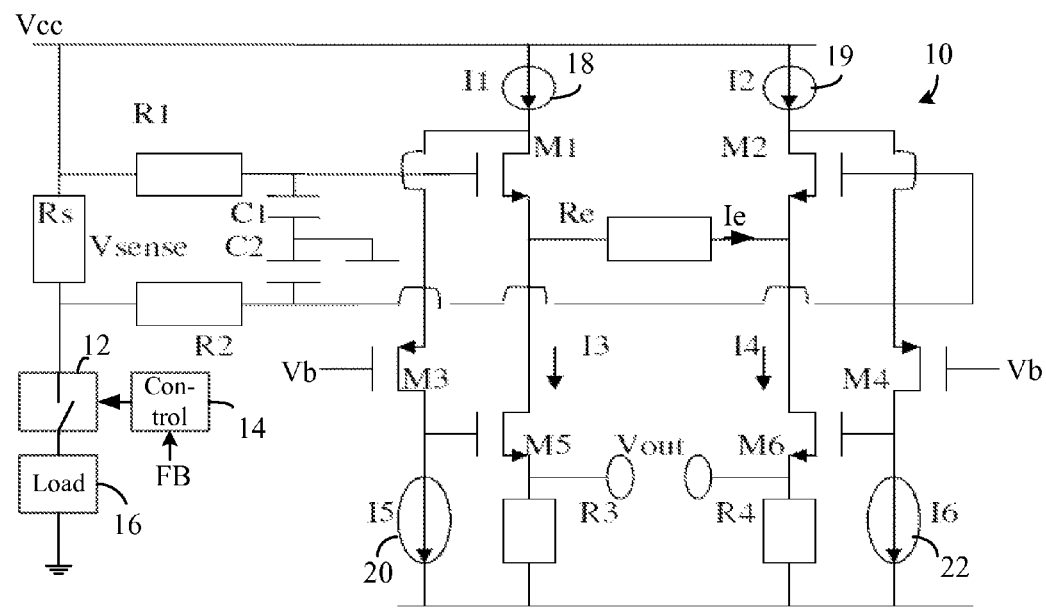
FIG. 1 is a schematic of a single chip current sense amplifier, in accordance with one embodiment of the invention, which detects the current through a low value sense resistor.

FIG. 1 illustrates a single chip current sense amplifier 10 that detects the current through a low value sense resistor Rs. The sense resistor Rs may be on-chip or off chip. In the example, current is intermittently conducted through the sense resistor Rs by the closing of a switch 12. The switch 12 may be a transistor having a duty cycle controlled by a controller 14 in a current mode DC-DC converter. The conventional output circuit of the converter and load are represented by block 16. The controller 14 uses the regulated voltage of the DC-DC converter and the current through the switch 12 as feedback signals to control the duty cycle. In another example, the sensed current may be for any other application, such as for accurately monitoring the current to a load connected directly to the sense resistor Rs without the switch 12.

When the switch 12 opens and closes, or the load current rapidly changes, there are relatively large, high-frequency transients that may dwarf the desired low-frequency differential voltage signal across the sense resistor Rs. Further, the power supply bus supplying the supply voltage Vcc may have transients from other devices on the bus. Such transients typically distort the transconductance (gm) of the amplifier, such as by saturating transistors, thus distorting the output voltage, which should be linearly proportional to the current through the sense resistor. To mitigate the spikes, an input filter is used.

The current sense amplifier 10 has a high input impedance since the differential inputs are the gates of the identical n-channel MOSFETs M1 and M2. A resistor R1 and capacitor C1, connected to ground or Vcc, form a low pass filter between the high side of the sense resistor Rs and the gate of MOSFET M1. Since the input current is very small, a high value resistor R1 and a relatively low value capacitor C1 can be used to adequately filter out the transients. The same filter component values for resistor R2 and capacitor C2 are used to filter the low side sense resistor Rs voltage. The hundreds kilo-ohm to mega-ohm resistors R1 and R2 and picofarads capacitors C1 and C2 can be easily formed on-chip using conventional techniques, such as using gate material as the plates of the capacitors C1 and C2. The components in both legs of the transconductance amplifier are ideally matched.

Current sources 18 and 19 supply identical fixed currents I1 and I2 and are connected to the drains of the MOSFETs M1 and M2.

Identical fixed currents I5 and I6, lower than I1 and I2, are generated by current sources 20 and 22.

The gate voltages of the MOSFETs M1 and M2 are the filtered high side and low side voltages, respectively, across the sense resistor Rs. The high side and low side voltages may have a high common mode voltage, such as 12 to 40 volts, which includes transient voltages, depending on the power supply voltage Vcc. The low frequency component of the sense voltage Vsense will typically be less than a few hundred millivolts due to the low value of the sense resistor Rs. Accordingly, it is desirable, in order to achieve a good signal to noise ratio, to provide a very stable transconductance (gm) while reducing common mode voltage transient disturbance.

MOSFETs M3 (a p-channel MOSFET), M5, and M1, and MOSFETs M4 (a p-channel MOSFET), M6, and M2, comprise feedback loops for their respective legs that improve the gain accuracy. The feedback loops cause the sources of MOSFETs M1 and M2 to precisely follow their gate voltages (i.e., the Vgs does not vary), so that the currents through MOSFETs M1 and M2 are the same irrespective of Vsense. The feedback formed by MOSFETs M3, M5 and M1 works as follows. If, for any reason, the source voltage of MOSFET M1 goes up to change the current through MOSFET M1, the drain voltages of MOSFETs M1 and M3 will go up. This will then lower the source voltage of MOSFET M1 to maintain a constant current through MOSFET M1. A similar feedback operation occurs for MOSFETs M2, M4, and M6 to keep the Vgs and current through MOSFET M2 constant. Due to the constant and equal Vgs of MOSFETs M1 and M2, the differential voltage across the resistor Re is the same as the differential voltage Vsense. A change in current through resistor Re does not change the currents through MOSFETs M1 and M2 but changes currents I3 and I4.

The resistor Re is connected between the sources of MOSFETs M1 and M2, and the value of the resistor Re sets the transconductance (gm) of the input stage of the transconductance amplifier as gm=1/Re. Due to a stable voltage across resistor Re, gm is stable.

The drain of MOSFET M3 is connected to the current source 20, generating the current I5, so the current I5 is tapped off the current source 18 and flows through MOSFET M3. Similarly, the drain of MOSFET M4 is connected to the current source 22, generating the current I6, so the current I6 is tapped off the current source 19 and flows through MOSFET M4. Currents I5 and I6 are equal. The current that flows through MOSFET M1 is I1-I5, and the current that flows through MOSFET M2 is I2-I6. A suitable fixed bias voltage Vb is applied to the gates of MOSFETs M3 and M4 to cause MOSFETs M3 and M4 to operate in the desired range.

The current Ie that flows through resistor Re is Vsense/Re. Therefore, the current I3 through MOSFET M5 is the current flowing though MOSFET M1 minus the current Ie. Similarly, the current I4 through MOSFET M6 is the current flowing though MOSFET M2 plus the current Ie. Accordingly, the differential current I4-I3 equals Vsense×(1/Re).

The MOSFETs M3 and M4 also level shift the common mode voltages at the drains of MOSFETs M1 and M2 to lower the common mode voltage at the gates of MOSFETs M5 and M6. This results in the common mode voltage at the sources of MOSFETs M5 and M6 to be lowered.

The differential output voltage Vout is $(I4*R4)-(I3*R3)$.      eq. 1

If the currents through MOSFETs M1 and M2 are Im1 and Im2, respectively, and the current through the resistor Re is Ie=Vsense/Re, then, $$I3=Im1-Ie, \text{ and} \quad \text{eq. 2}$$

$$I4=Im2+Ie. \quad \text{eq. 3}$$

Since, Im1 and Im2 are equal, and R3 and R4 are equal, combining equations 1-3 results in, $$Vout=(Im2+Ie)*R4-(Im1-Ie)*R3=(R3+R4)*Ie=Vsense*(R3+R4)/Re. \quad \text{eq. 4}$$

The values of the components in FIG. 1 may be selected to generate any currents and any amount of down conversion of the Vsense common mode voltage. Optimal components may be selected using simulation. The current sources 20 and 22 may be connected to ground or another reference voltage.

Accordingly, the circuit of FIG. 1 allows for an input RC filter to be on-chip with the remainder of the circuit due to the high impedance of the transconductance amplifier, the amplifier level-shifts the Vsense common mode voltage to be compatible with any downstream device, and the gm of the amplifier is stabilized by a feedback loop. All these improvements are accomplished with a single chip, single stage transconductance amplifier.

Additional embodiments are described below that provide various improvements over the circuit of FIG. 1.

Figure 2:
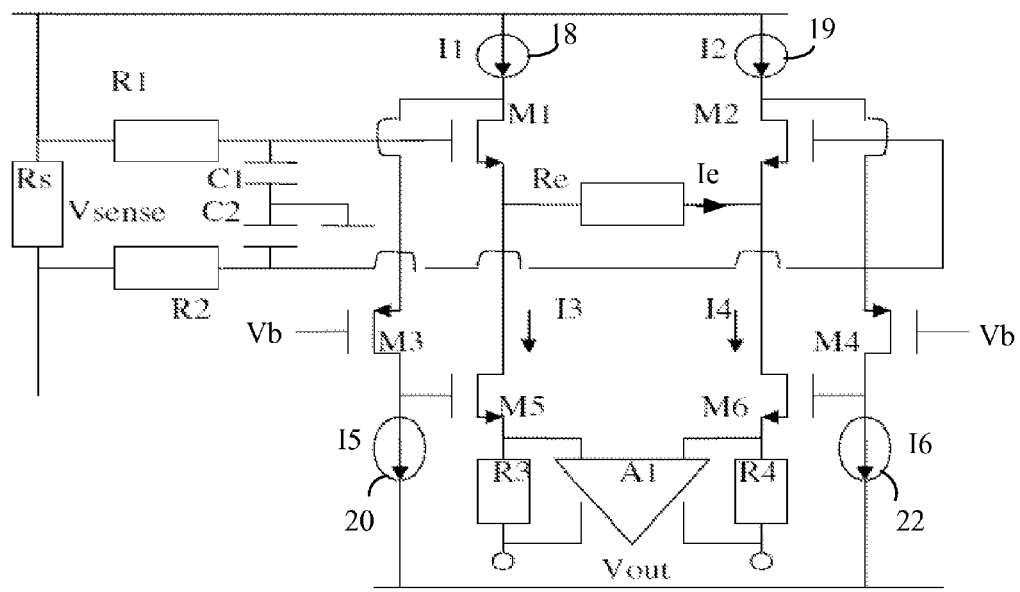
FIG. 2 is a schematic of another single chip current sense amplifier, in accordance with another embodiment of the invention, using a differential amplifier at the output to further stabilize the gain and achieve other advantages.

FIG. 2 is identical to the circuit of FIG. 1 except that it uses a differential amplifier A1 at the output to further stabilize the gain and achieve other advantages. The amplifier A1 has inverting and non-inverting inputs and output a differential Vout. The currents I3 and I4 flow though the feedback resistors R3 and R4. The output voltage Vout remains as Vsense*(R3+R4)/Re. The advantage of the circuit of FIG. 2 over that of FIG. 1 is that the source voltages of MOSFETs M5 and M6 are independent of Vout, giving Vout a larger swing and the circuit more headroom.

Figure 3:
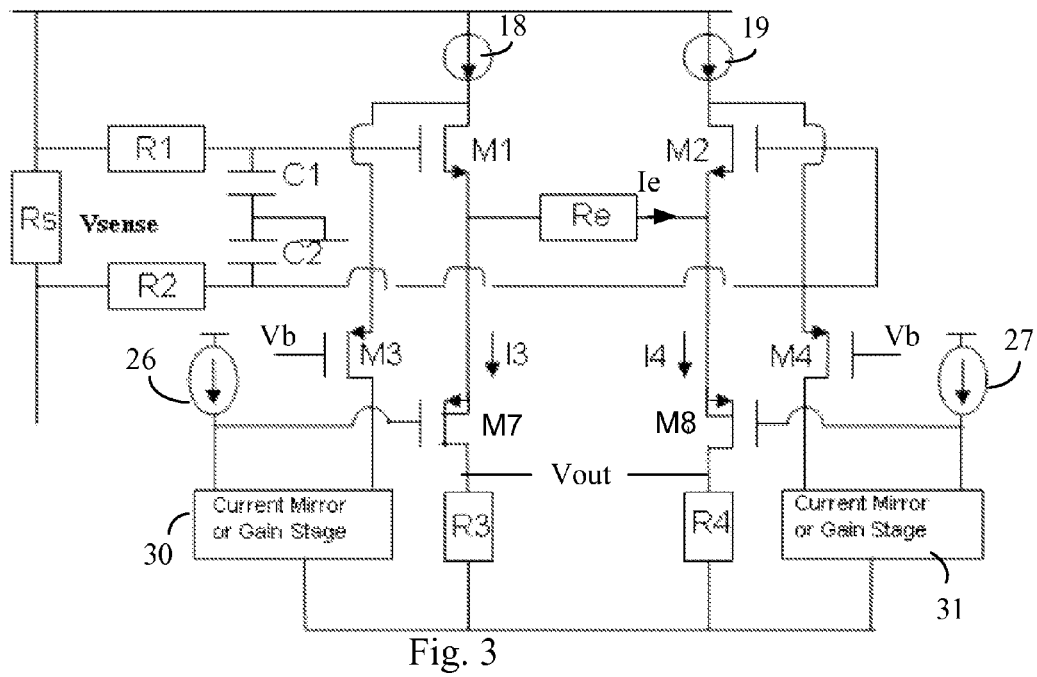
FIG. 3 is a schematic of another single chip current sense amplifier, in accordance with another embodiment of the invention, using PMOS transistors in a fast feedback loop having their substrates tied to their sources to make the amplifier's performance insensitive to impact ionization of the PMOS transistors.

FIG. 3 is identical to FIG. 1 except that the n-channel MOSFETs M5 and M6 in FIG. 1 are replaced by p-channel MOSFETs M7 and M8 having their bulk substrates tied to their sources. The gates of MOSFETs M7 and M8 are tied to their respective current sources 26 and 27. The current sources 26 and 27 are mirrored by a conventional current mirror or current gain stage 30 or 31 for drawing a certain fixed current through MOSFETs M3 and M4. The stages 30/31 and "pull-up" current sources 26 and 27 are needed due to the MOSFETs M7 and M8 having polarities that are opposite to the polarities of MOSFETs M5 and M6 in FIG. 1. By tying the substrate to the sources of MOSFETs M7 and M8, there is no current loss through the substrate due to impact ionization. The substrates of MOSFETs M5 and M6 in FIG.

1 could not be tied to their sources in a standard CMOS process. The operations of the circuits of FIGS. 1 and 3 are otherwise identical. In FIG. 3, Vout remains equal to Vsense*(R3+R4)/Re.

Figure 4:
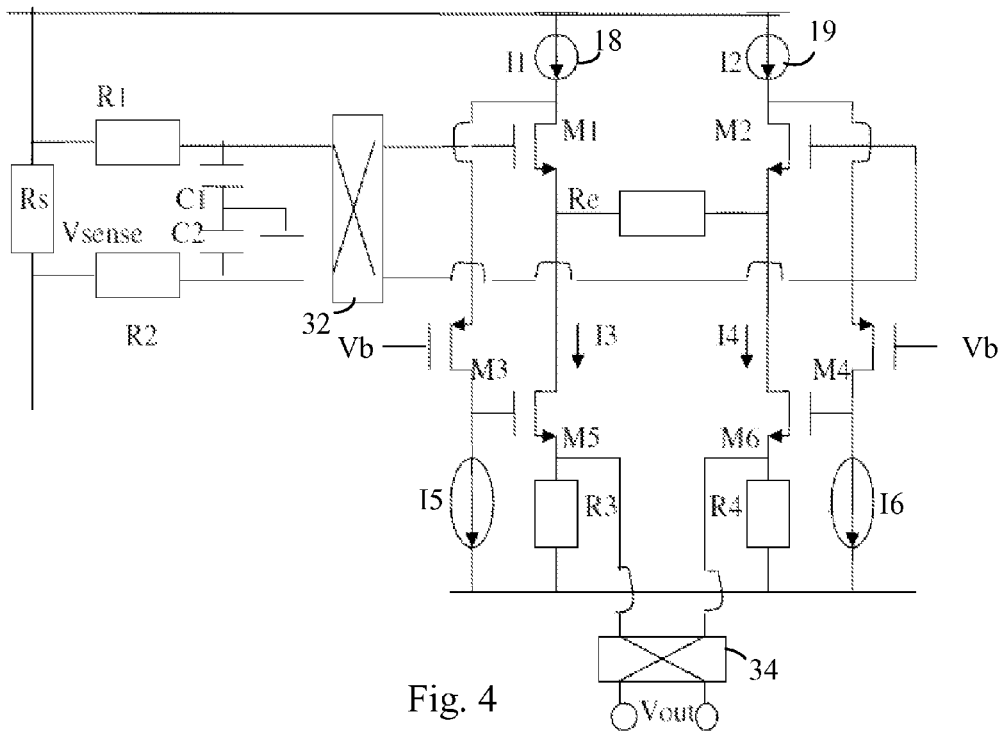
FIG. 4 is a schematic of another single chip current sense amplifier, in accordance with another embodiment of the invention, which uses synchronized choppers to cancel offsets in the output voltage due to mismatched components in the legs of the differential transconductance amplifier.

If the components in the two legs of the transconductance amplifier are not perfectly matched, there will be an offset voltage introduced, resulting in an error in Vout, where Vout would then not equal Vsense*(R3+R4)/Re. To compensate for such imperfect matching of components in the real world, the circuit of FIG. 4 uses synchronized choppers 32 and 34 that are continually switched to alternately provide a straight-through conduction path and a crossed conduction path. The amplifier's DC offset is thus modulated at the chopping frequency by chopper 34 and is then filtered by a conventional on-chip low pass filter (not shown). The Vout polarity is not changed by the choppers since it passes through both choppers 32 and 34.

FIGS. 5A, 5B, and 5C illustrate an embodiment of one of the choppers 32 or 34. The switching is controlled by a clock at any suitable frequency. Input terminals 36 and 38 are switched by switch pairs S1 and S2 to alternately be connected to output terminals 40 or 42. The switch pair S1 is controlled oppositely from the switch pairs S2. FIG. 5C illustrates the clocking of the switch pairs S1 and S2, where a high level closes the switches. The clock pulse widths are set to avoid cross-conduction by ensuring that one pair is completely off before the other pair is turned on. The switches are typically transistors.

FIG. 6 is a schematic of another single stage current sense amplifier that uses a synchronized chopper to cancel offsets in the output voltage, where the output voltage Vout is referenced to a non-ground voltage V2. V2 can be a DC or a variable voltage. The differential output current Iout equals Vsense*1/Re. FIG. 6 is very similar to FIG. 4 except for the addition of MOSFETs M10 and M11.

MOSFET M9, resistor Rref, and current source 38 act as a bias voltage generator to provide a bias voltage to the gates of MOSFETs M3 and M4. Such a bias voltage generator may be used in the other embodiments to generate the bias voltage Vb. Currents I5 and I6, generated by current sources 40 and 42, flow through MOSFETs M3 and M4. The currents through resistors R5 and R6 create a source voltage Vs for MOSFETs M3 and M4.

The gate of MOSFET M5 is driven by the voltage at the junction of current source 40 and MOSFET M3 to allow MOSFET M5 to increase or reduce its current by Vsense/Re. Similarly, the gate of MOSFET M6 is driven by the voltage at the junction of current source 42 and MOSFET M4 to allow MOSFET M6 to increase or reduce its current by Vsense/Re.

The gate of MOSFET M5 is coupled to the gate of MOSFET M10. If MOSFETs M5 and M10 are the same size, their currents will be the same. The current I10 through MOSFET M10 flows from the V2 supply and through resistor R7 (depending on the state of the chopper 34) to generate a voltage (V2−(I10*R7)) at the upper Vout terminal. The right side of the amplifier comprising MOSFETs M4, M2, M6, and M11 operates in a manner identical to that of its counterpart to generate a voltage (V2−(I11*R8)) at the lower Vout terminal.

Vout=Vsense*(R7+R8)/Re, where the output voltage Vout is level shifted to V2 to be compatible with any downstream device.

The current sense amplifiers of FIGS. 2-4 and 6 have the all the advantages stated with regards to FIG. 1 plus additional advantages, described above. All the current sense amplifiers are single stage circuits, and each may be easily formed on the same integrated circuit chip. The chip may include the sense resistor Rs and output the differential output voltage Vout. The load and any other circuitry may also be formed on the same chip as the current sense amplifier. Although the theoretical operations of the circuits have been described, inherent losses and mismatches may occur in actual embodiments, so the various voltages described herein are approximate.

In some applications, it is desirable to have an output current (rather than Vout) proportional to Vsense. In such applications, resistors R3 and R4 may be deleted.

The circuits described herein are formed with conventional CMOS technology. However, the circuits may easily be formed using bipolar transistors or using BiCMOS technology.

Accordingly, while particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:
1. A current sense amplifier comprising:
a sense resistor configured to be connected to conduct a current to generate a sense voltage (Vsense) across the sense resistor;
a filter coupled to the sense resistor to generate a filtered Vsense signal;
a single-stage differential transconductance amplifier having high impedance input terminals couple to receive the filtered Vsense signal, the transconductance amplifier comprising:
  a differential pair of input transistors having control terminals coupled to receive the filtered Vsense signal;
  a gain control resistor directly coupled across first terminals of the pair of transistors, the gain control resistor conducting only a current equal to a difference in voltages at the first terminals of the pair of transistors, substantially equal to the filtered Vsense signal, divided by the value (Re) of the gain control resistor, such that the current (Ie) substantially equals the filtered Vsense signal divided by Re;
a separate level shifting circuit coupled to each of the input transistors configured to lower a common mode voltage of the filtered Vsense signal at an output of the transconductance amplifier; and
  each level shifting circuit being part of a feedback loop for its associated input transistor to cause a current through each of the input transistors to be substantially constant and equal as the filtered Vsense signal varies to cause the filtered Vsense signal to substantially occur across the gain control resistor,
  wherein the transconductance amplifier generates a differential output, at differential output terminals, proportional to the current through the sense resistor.
2. The amplifier of claim 1 further comprising:
a first chopper circuit coupled between the filter and the input terminals of the transconductance amplifier; and
a second chopper circuit coupled across the differential output terminals,
the first chopper and second chopper being connected to switch in a synchronized manner.
3. The amplifier of claim 1 wherein the filter and the transconductance amplifier are formed on a single chip.
4. The amplifier of claim 1 wherein the input transistors are MOSFETs.

5. The amplifier of claim 4 wherein the MOSFETs comprise a first MOSFET and a second MOSFET, wherein the feedback loop associated with the first MOSFET comprises:
a third MOSFET coupled in series with the first MOSFET; and
a fourth MOSFET coupled between a drain of the first MOSFET and a first current source, wherein a gate of the third MOSFET is coupled between the fourth MOSFET and the first current source.

6. The amplifier of claim 5 wherein the first MOSFET and third MOSFET are n-channel MOSFETs, and the fourth MOSFET is a p-channel MOSFET.

7. The amplifier of claim 6 further comprising a second current source coupled between the drain of the first MOSFET and a power supply voltage, wherein the first current source is coupled to ground.

8. The amplifier of claim 7 wherein the feedback loop associated with the second MOSFET comprises:
a fifth MOSFET coupled in series with the second MOSFET; and
a sixth MOSFET coupled between a drain of the second MOSFET and a third current source, wherein a gate of the fifth MOSFET is coupled between the sixth MOSFET and the third current source.

9. The amplifier of claim 8 wherein the second MOSFET and fifth MOSFET are n-channel MOSFETs, and the sixth MOSFET is a p-channel MOSFET.

10. The amplifier of claim 9 further comprising a fourth current source coupled between the drain of the second MOSFET and the power supply voltage, wherein the third current source is coupled to ground.

11. The amplifier of claim 10 wherein a differential voltage is generated across sources of the third MOSFET and the fifth MOSFET substantially proportional to the Vsense signal.

12. The amplifier of claim 11 further comprising a first resistor, having a value R1, coupled between a source of the third MOSFET and ground, and a second resistor, having a value R2, coupled between a source of the fifth MOSFET and ground, wherein a first current through the first resistor and a second current through the second resistor create the differential output (Vout) at the differential output terminals, proportional to the current through the sense resistor, such that Vout substantially equals Vsense*(R1+R2)/Re.

13. The amplifier of claim 12 further comprising a differential amplifier coupled to the sources of the third MOSFET and the fifth MOSFET, an output of the differential amplifier providing the differential output of the transconductance amplifier.

14. The amplifier of claim 12 further comprising a chopper receiving the differential voltage, a filtered output of the chopper providing the differential output of the transconductance amplifier.

15. The amplifier of claim 4 wherein the MOSFETs comprise a first MOSFET and a second MOSFET, wherein the feedback loop associated with the first MOSFET comprises:
a third MOSFET coupled in series with the first MOSFET, wherein the third MOSFET is a p-channel MOSFET; and
a fourth MOSFET coupled between a drain of the first MOSFET and a first current source, wherein the fourth MOSFET is a p-channel MOSFET, wherein the first current source is a current mirror of a second current source, and wherein a gate of the third MOSFET is coupled to the second current source.

16. The amplifier of claim 4 wherein the MOSFETs comprise a first MOSFET and a second MOSFET, wherein the feedback loop associated with the first MOSFET is configured to cause its gate-source voltage to be substantially constant as the filtered Vsense signal changes, and wherein the feedback loop for the second MOSFET is configured to cause its gate-source voltage to be substantially constant as the filtered Vsense signal changes and substantially equal to the gate-source voltage of the first MOSFET.

17. A method performed by a current sense amplifier comprising:
conducting a current through a sense resistor to generate a sense voltage (Vsense) across the sense resistor;
filtering Vsense to generate a filtered Vsense signal;
applying the filtered Vsense signal to high impedance input terminals of a single-stage differential transconductance amplifier, the transconductance amplifier performing the method comprising:
receiving the filtered Vsense signal at control terminals of a differential pair of input transistors;
generating the filtered Vsense signal across a gain control resistor coupled across first terminals of the pair of transistors, the gain control resistor being directly coupled across the first terminals of the pair of transistors so as to conduct only a current equal to a difference in voltages at the first terminals of the pair of transistors, substantially equal to the filtered Vsense signal, divided by the value (Re) of the gain control resistor, such that the current (Ie) substantially equals the filtered Vsense signal divided by Re;
causing a current through each of the input transistors to be substantially constant and equal, by action of a feedback loop associated with each of the input transistors, as the filtered Vsense signal varies, to cause the filtered Vsense signal to substantially occur across the gain control resistor; and
level shifting a common mode voltage of the filtered Vsense signal at an output of the transconductance amplifier,
wherein the transconductance amplifier generates a differential output, at differential output terminals, proportional to the current through the sense resistor.

18. The method of claim 17 further comprising:
chopping the filtered Vsense signal across the input terminals of the transconductance amplifier to alternately provide a straight-through path and a cross-conduction path; and
chopping an output of the transconductance amplifier to alternately provide a straight-through path and a cross-conduction path across the differential output terminals in a manner synchronized with chopping the filtered Vsense signal.

19. The method of claim 17 wherein the input transistors comprise a first MOSFET and a second MOSFET, wherein the feedback loop associated with the first MOSFET is configured to cause its gate-source voltage to be substantially constant as the filtered Vsense signal changes, and wherein the feedback loop associated with the second MOSFET is configured to cause its gate-source voltage to be substantially constant as the filtered Vsense signal changes and substantially equal to the gate-source voltage of the first MOSFET.

20. The method of claim 19 wherein a third MOSFET is coupled in series with the first MOSFET, and a fourth MOSFET is coupled in series with the second MOSFET, wherein a differential voltage is generated across sources of the third MOSFET and the fourth MOSFET substantially proportional to the filtered Vsense signal, the method further comprising:
conducting a first current from the third MOSFET through a first resistor, having a value R1, coupled between a source of the third MOSFET and ground;

conducting a second current from the fourth MOSFET through a second resistor, having a value R2, coupled between a source of the fourth MOSFET and ground, wherein the first current through the first resistor and the second current through the second resistor create the differential output (Vout) at the differential output terminals, proportional to the current through the sense resistor, such that Vout substantially equals the filtered Vsense signal times (R1+R2)/Re.

* * * * *

UNITED STATES PATENT AND TRADEMARK OFFICE
CERTIFICATE OF CORRECTION

| | | |
|---|---|---|
| PATENT NO. | : 8,648,623 B2 | Page 1 of 1 |
| APPLICATION NO. | : 13/448161 | |
| DATED | : February 11, 2014 | |
| INVENTOR(S) | : Hengsheng Liu et al. | |

It is certified that error appears in the above-identified patent and that said Letters Patent is hereby corrected as shown below:

Title Page, below Item (54) change "(76) Inventors" to --(75) Inventors--.

Title Page, above "(*) Notice" insert

--(73) Assignee: Linear Technology Corporation--.

Signed and Sealed this
Twentieth Day of May, 2014

Michelle K. Lee
*Deputy Director of the United States Patent and Trademark Office*